United States Patent
Cai et al.

(10) Patent No.: US 10,246,323 B2
(45) Date of Patent: Apr. 2, 2019

(54) CAVITY FORMING METHOD FOR A SENSOR CHIP, MANUFACTURING METHOD THEREOF, CHIP AND ELECTRONICS APPARATUS

(71) Applicant: Goertek, Inc., Weifang, Shandong (CN)

(72) Inventors: Mengjin Cai, Weifang (CN); Qinglin Song, Weifang (CN)

(73) Assignee: GOERTEK, INC., Weifang, Shandong (CN)

( * ) Notice: Subject to any disclaimer, the term of this patent is extended or adjusted under 35 U.S.C. 154(b) by 0 days.

(21) Appl. No.: 15/559,407

(22) PCT Filed: Dec. 15, 2015

(86) PCT No.: PCT/CN2015/097503
§ 371 (c)(1),
(2) Date: Dec. 14, 2017

(87) PCT Pub. No.: WO2016/173268
PCT Pub. Date: Nov. 3, 2016

(65) Prior Publication Data
US 2018/0086631 A1    Mar. 29, 2018

(30) Foreign Application Priority Data
Apr. 28, 2015    (CN) .......................... 2015 1 0210301

(51) Int. Cl.
*H01L 21/76* (2006.01)
*B81C 1/00* (2006.01)

(52) U.S. Cl.
CPC ...... *B81C 1/00047* (2013.01); *B81C 1/00079* (2013.01); *B81C 1/00158* (2013.01); *B81C 1/00269* (2013.01); *B81C 1/00555* (2013.01); *B81B 2201/0264* (2013.01)

(58) Field of Classification Search
CPC .... B81C 1/00; B81C 1/00047; B81C 1/00079
USPC ........................................................ 438/422
See application file for complete search history.

(56) References Cited

FOREIGN PATENT DOCUMENTS

| CN | 102390803 | * | 3/2012 | ............... B81C 1/00 |
| CN | 102390803 | A | 3/2012 | |
| CN | 103335753 | A | 10/2013 | |
| CN | 204588690 | U | 8/2015 | |
| CN | 104925745 | A | 9/2015 | |
| JP | 2000-230877 | A | 8/2000 | |

* cited by examiner

*Primary Examiner* — David S Blum
(74) *Attorney, Agent, or Firm* — Hultquist, PLLC; Steven J. Hultquist

(57) ABSTRACT

A method for forming a cavity of a sensor chip. The method comprises forming a first groove (a2) on a substrate (a1); bonding a covering layer (a4) onto the substrate (a1) to cover the first groove (a2), thereby forming a cavity; and etching the covering layer (a4) to decrease a thickness of the covering layer. The method can implement a thinner thickness of a film, thereby improving the sensitivity of a sensor.

9 Claims, 5 Drawing Sheets

CAVITY FORMING METHOD FOR A SENSOR CHIP, MANUFACTURING METHOD THEREOF, CHIP AND ELECTRONICS APPARATUS

CROSS-REFERENCE TO RELATED APPLICATIONS

This application is a U.S. national phase under the provisions of 35 U.S.C. § 371 of International Patent Application No. PCT/CN2015/097503 filed Dec. 15, 2015, which in turn claims priority of Chinese Patent Application No. 201510210301.1 filed Apr. 28, 2015. The disclosures of such international patent application and Chinese priority patent application are hereby incorporated herein by reference in their respective entireties, for all purposes.

FIELD OF THE INVENTION

The present invention relates to a Micro-Electro-Mechanical System (MEMS) pressure sensor chip, and in particular, to a method for forming a cavity in a MEMS pressure sensor chip, a method for manufacturing a MEMS pressure sensor chip, a MEMS pressure sensor chip and an electronics apparatus.

BACKGROUND OF THE INVENTION

MEMS pressure sensor chips have already extensively been used in the industries of biology, automobile and so on. Generally, a MEMS pressure sensor chip includes a cavity for sensing ambient pressure changes.

In the designs of the prior art MEMS pressure sensor chips, there are mainly two approaches for forming a cavity. The first one is an approach of grinding and the second one is an approach of using a SOI (Silicon on Insulator) wafer.

In the first approach, a groove is first formed in a substrate, and then a bonding layer is formed. The bonding layer can be oxide. The bonding layer can be formed on the substrate, or can be formed on an upper membrane wafer for covering the groove. Then, the upper membrane wafer is bonded onto the substrate via the bonding layer for covering and sealing the groove to form a cavity. Finally, the upper membrane wafer is ground to thin its thickness. In this approach, because of the limitation of grinding processing, the thickness of the membrane formed by the upper membrane wafer is over 10 µm.

The second approach is similar with the first one. The difference lies in that the upper membrane wafer is a SOI wafer. A SOI wafer includes a membrane layer, an insulation layer and an upper silicon layer. After the SOI wafer is bonded to the substrate, the insulation layer is removed to remove the upper silicon layer. A thinner structure can be obtained by using a SOI wafer, but it has a relatively high cost.

Therefore, it is demanded to make an improvement in at least one aspect of the prior art.

SUMMARY OF THE INVENTION

One object of this disclosure is to provide a new technical solution for forming a cavity in a MEMS pressure sensor chip.

According to an embodiment of this invention, there is provided a method for forming a cavity in a MEMS pressure sensor chip, comprising: forming a first groove in a substrate; bonding a covering layer onto the substrate to cover the first groove, so as to form a cavity; and etching the covering layer to lower the thickness of the covering layer.

Preferably, the step of bonding a covering layer onto the substrate further comprises: bonding the covering layer onto the substrate through a fusion bonding.

Preferably, the step of bonding a covering layer onto the substrate further comprises: bonding the covering layer onto the substrate through a bonding layer. Preferably, the bonding layer is an oxide layer.

Preferably, the surface of the first groove has an oxide layer.

Preferably, the bonding layer is formed on the substrate or on the covering layer.

Preferably, the covering layer is a pure silicon wafer or an epitaxial wafer.

Preferably, the step of etching the covering layer further comprises: wet-etching the covering layer.

Preferably, the wet-etching includes a chemical etching.

Preferably, the step of etching the covering layer further comprises: patterning the covering layer to etch a portion of the covering layer corresponding to the cavity.

Preferably, the etched covering layer has a thickness lower than 10 µm. Preferably, the etched covering layer has a thickness lower than 5 µm.

Preferably, the substrate is a silicon substrate.

Preferably, the covering layer is ground to lower a thickness of the covering layer before etching the covering layer.

Preferably, the method further comprises: forming a thermal oxide layer on an etched surface of the covering layer, and removing the thermal oxide layer, to re-lower the thickness of the covering layer.

According to another embodiment of this invention, there is provided a method for manufacturing a MEMS pressure sensor chip, comprising: forming a cavity in the MEMS pressure sensor chip by using the method for forming a cavity in a MEMS pressure sensor chip according to the present invention.

According to another embodiment of this invention, there is provided a MEMS pressure sensor chip, which is manufactured by using the method for manufacturing a MEMS pressure sensor chip according to the present invention.

According to another embodiment of this invention, there is provided an electronics apparatus, which includes a MEMS pressure sensor chip according to the present invention.

An advantage of the solution of this disclosure lies in that a membrane in a high performance MEMS pressure sensor chip can be formed with a relatively low cost.

The inventors of the present invention have found that, in the prior art, the thickness of a membrane of the cavity in a MEMS pressure sensor chip is thinned by grinding, or a thin cavity membrane is obtained by SOI wafer. This invention adopts a different measure. In this invention, the membrane thickness is further thinned by an etching processing, rather than removing a certain layer. So, the task to be implemented by or the technical problem to be solved by the present invention has not been conceived or anticipated by a person skilled in the art and thus the present invention is a new solution.

In addition, it should be understood by a person skilled in the art that, although a lot of problems exist in the prior art, the solution of each embodiment or each claim could just improve in one or several aspects, and it is not necessary for it to solve all the technical problems listed in the Background of the Invention or in the prior art. It should be understood by a person skilled in the art that content which is not mentioned in a claim should not be regarded as a limitation to said claim.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
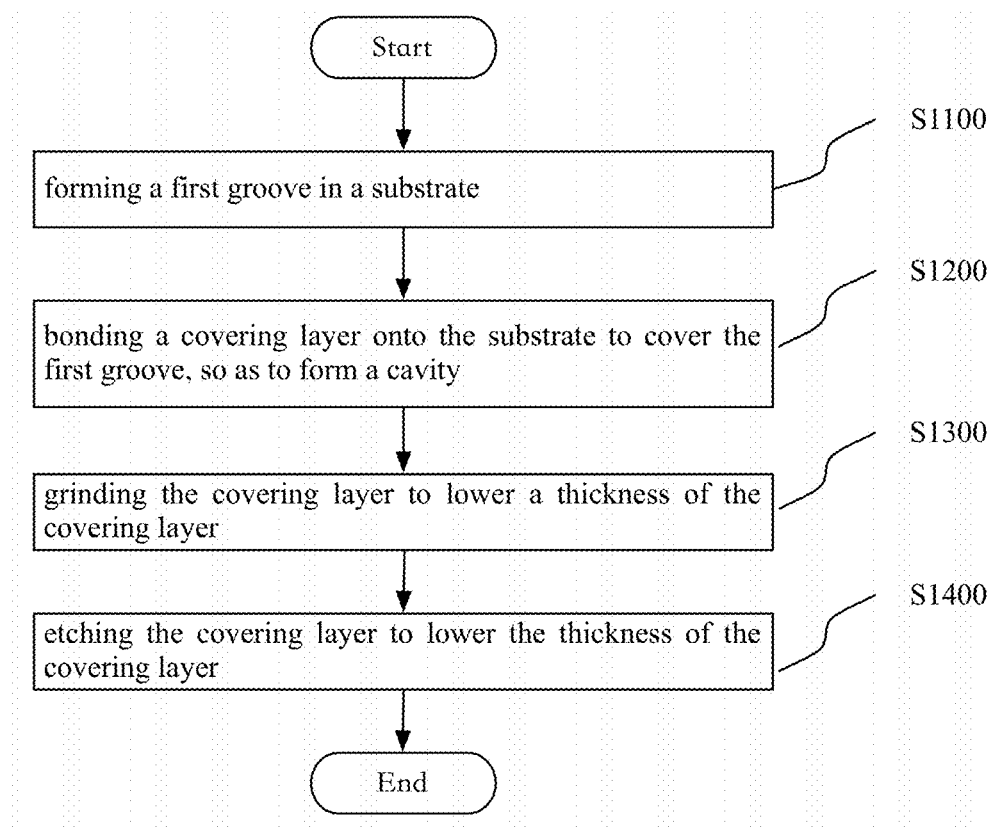
FIG. 1 is a flow chart of an exemplary embodiment of a method according to the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Embodiments and examples according to the present invention will be described with reference to the drawings.

FIG. 1 shows a flow chart of an exemplary embodiment of a method according to the present invention for forming a cavity in a MEMS pressure sensor chip.

As shown in FIG. 1, at step S1100, a first groove is formed in a substrate.

For example, the substrate is a silicon substrate.

At step S1200, a covering layer is bonded onto the substrate to cover the first groove, so as to form a cavity.

For example, the covering layer may be a pure silicon wafer or an epitaxial wafer.

For example, the covering layer may be bonded onto the substrate through a fusion bonding.

In an example, by using the prior approach, a bonding layer is first formed, and then the covering layer is bonded onto the substrate via the bonding layer. For example, the bonding layer can be an oxide layer. The bonding layer can be formed on the substrate. Or it can be formed on the covering layer. In a case where the bonding layer is formed on the substrate, the surface of the first groove can have an oxide layer (bonding layer); otherwise, it may not have the oxide layer.

Optionally, at step S1300, the covering layer is ground to lower its thickness. In some embodiment, the step S1300 can be omitted.

At step S1400, etching the covering layer to lower the thickness of the covering layer.

Different from the prior art SOI approach, in this invention, the thickness of the covering layer is thinned by using an etching technique, rather than obtaining a membrane by removing a silicon layer on a insulation layer.

The etching processing may include a dry etching or a wet etching. Preferably, a wet etching is used in the step S1400, for example, a chemical wet etching.

During the etching, the covering layer may be patterned to etch a portion of the covering layer corresponding to the cavity.

In an example of the present invention, only the portion of the covering layer corresponding to the cavity may be etched with other portions remaining. This processing may be advantageous. For example, the thicker portions around the membrane make the membrane more stable. As such, in a case of keeping a high sensing performance, the stability can be improved to some degree. In addition, for example, in some situation, it may be a certain design freedom to a designer. For example, a designer can choose to etch the entire covering layer or part of it, and can choose which part to etch.

In the prior art, the membrane thickness obtained by grinding is larger than 10 μm. However, in this invention, the thickness of the covering layer obtained after etching can be less than 10 μm, and preferably, less than 5 μm, for example.

After the etching, a thermal oxide layer can be formed on an etched surface of the covering layer, and then the thermal oxide layer is removed to re-lower the thickness of the covering layer. This can precisely control the lowered thickness, which can be within 1 μm.

Through the solution of this invention, a thinner membrane can be obtained without using a high cost SOI wafer, while keep the sensor in a relatively high sensitivity. So, compared with the prior art grinding approach, the solution of this invention can obtain a thinner membrane; and compared with the SOI wafer approach, a normal silicon wafer or an epitaxial wafer can be used in this invention to lower the cost.

In another embodiment, the present invention further provides a method for manufacturing a MEMS pressure sensor chip. The manufacturing method comprises: forming a cavity in the MEMS pressure sensor chip by using the method for forming a cavity in a MEMS pressure sensor chip according to the present invention.

In another embodiment, the present invention further provides a MEMS pressure sensor chip. The chip is manufactured by using the method for forming a cavity in a MEMS pressure sensor chip according to the present invention.

For example, in an example, the MEMS pressure sensor chip can include a cavity for sensing pressure, which is formed by a substrate, a first groove in the substrate and a covering layer. The substrate is bonded with the covering layer through bonding to seal the cavity, the covering layer has an etched second groove in the surface opposite to the substrate, and the bottom of the second groove corresponds to the cavity. In this example, since the covering layer including the membrane above the cavity is of a grooveshape, the periphery of the membrane is relatively thick. This makes the membrane more stable. As such, in a case of keeping a high sensing performance, the stability of the membrane can be improved to some degree. In addition or optionally, it may be a certain design freedom to a designer. For example, a designer can choose which part to etch.

For example, the bonding is a fusion bonding. For example, a bonding layer can be included between the substrate and the covering layer. The bonding layer can be an oxide layer. The oxide layer can just be provided between the covering layer and substrate, and the surface of the first groove does not have such a oxide layer.

For example, the covering layer may be a silicon wafer or an epitaxial wafer. The thickness of the covering layer at the bottom of the second groove can be less than 10 μm, and preferably, less than 5 m. For example, the substrate can be silicon substrate. For example, an oxide layer may be formed on the surface of the second groove.

In another embodiment, the present invention further provides an electronics apparatus, which includes a MEMS pressure sensor chip according to the present invention. For example, the electronics apparatus can be a smart phone, a pad, an automobile, an medical apparatus and so on.

Below, an example for forming a cavity in a MEMS pressure sensor chip according to the present invention will be described with reference to FIGS. 2-7.

Figure 2:
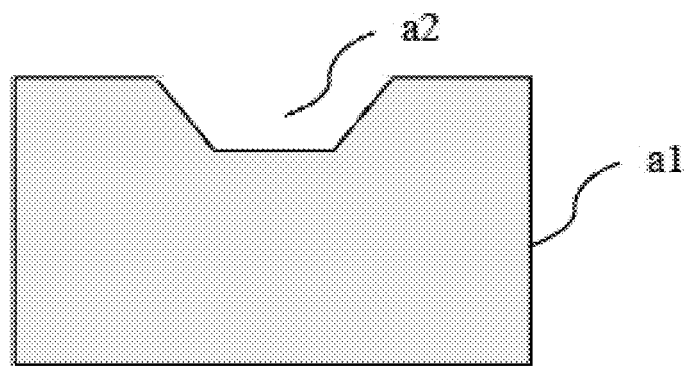
FIGS. 2-7 are a schematic diagram of an example for forming a cavity in a MEMS pressure sensor chip according to the present invention.

As shown in FIG. 2, a groove a2 is formed on a silicon substrate a1. For example, the groove a2 can be formed through etching.

Figure 3:
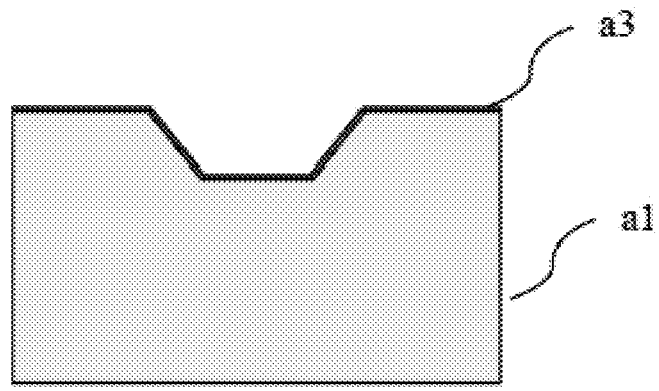

As shown in FIG. 3, a bonding layer a3 is deposited on the silicon substrate a1.

Figure 4:
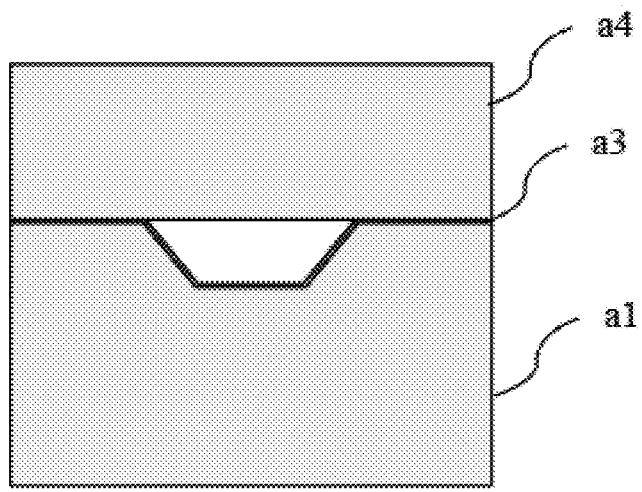

As shown in FIG. 4, a pure silicon wafer a4 is bonded onto the silicon substrate a1 via the bonding layer a3 through a fusion bonding.

Figure 5:
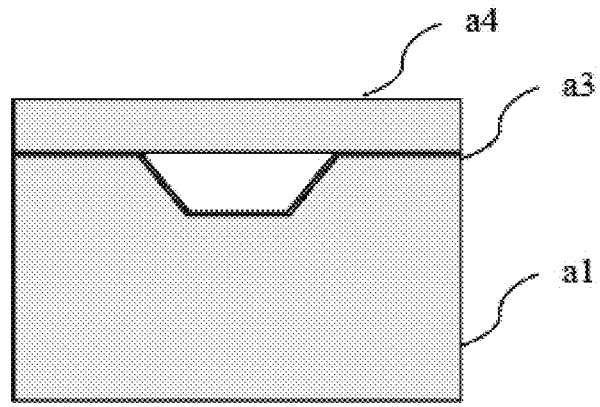

As shown in FIG. 5, the thickness of pure silicon wafer a4 is thinned through grinding.

Figure 6:
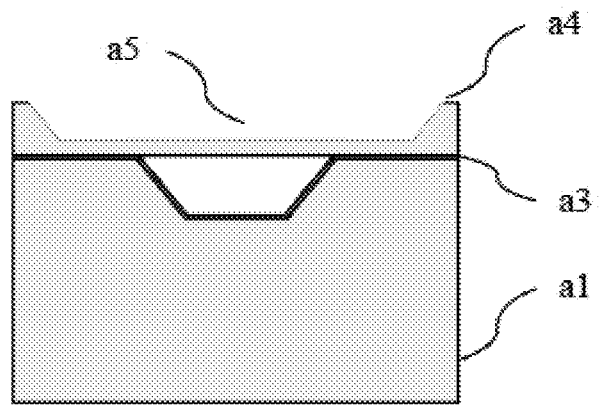

As shown in FIG. 6, the portion of the pure silicon wafer a4 corresponding to the cavity is further thinned through a wet-etching such as KOH, TMAH or ECE and so on. A groove a5 is formed on the pure silicon wafer a4.

Figure 7:
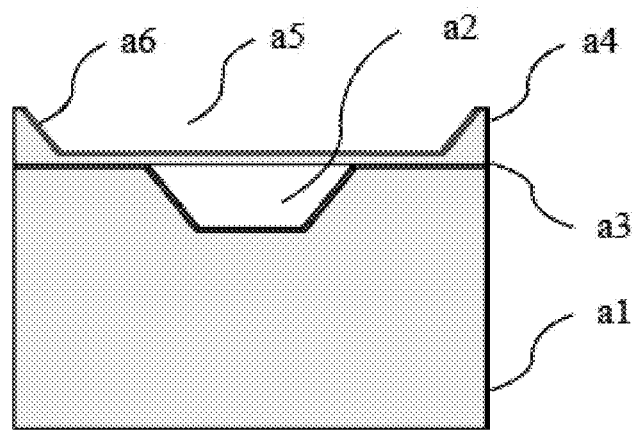

As shown in FIG. 7, an oxide film is formed on the groove a5.

Below, another example for forming a cavity in a MEMS pressure sensor chip according to the present invention will be described with reference to FIGS. 8-13. The difference between the example of FIGS. 8-13 and that of FIGS. 2-7 lies in that an epitaxial wafer is used in the example of FIGS. 8-13, instead of the pure silicon wafer, to form the membrane.

Figure 8:
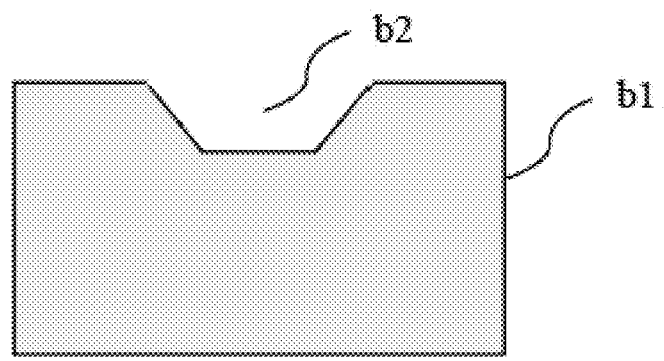
FIGS. 8-13 are a schematic diagram of an example for forming a cavity in a MEMS pressure sensor chip according to the present invention.

As shown in FIG. 8, a groove b2 is formed on a silicon substrate b1. For example, the groove b2 can be formed through etching.

Figure 9:
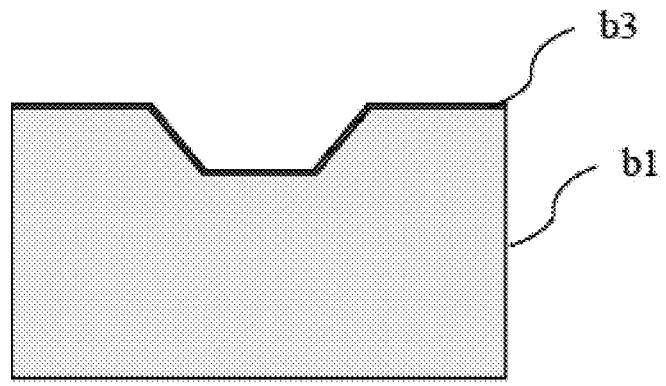

As shown in FIG. 9, a bonding layer b3 is deposited on the silicon substrate b1.

Figure 10:
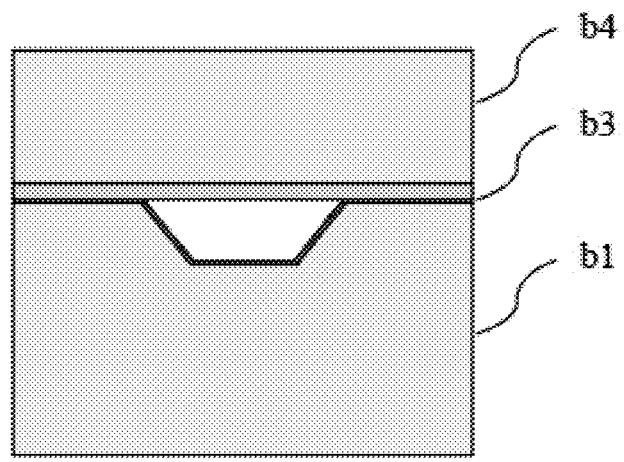

As shown in FIG. 10, an epitaxial wafer b4 is bonded onto the silicon substrate b1 via the bonding layer b3 through a fusion bonding.

Figure 11:
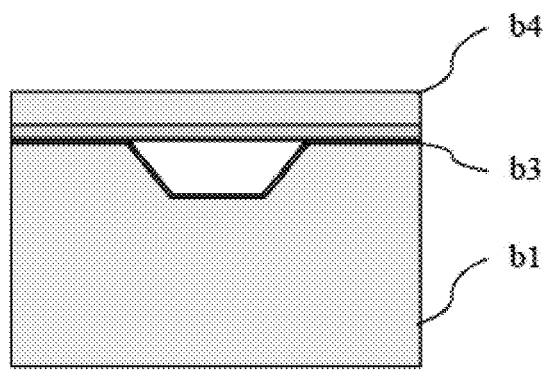

As shown in FIG. 11, the thickness of the epitaxial wafer b4 is thinned through grinding.

Figure 12:
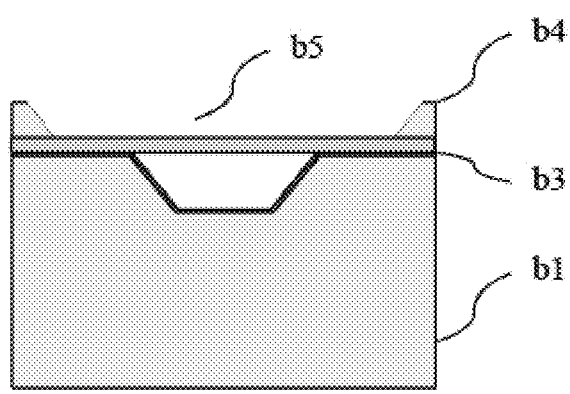

As shown in FIG. 12, the portion of the epitaxial wafer b4 corresponding to the cavity is further thinned through a wet-etching such as KOH, TMAH or ECE and so on. A groove b5 is formed on the epitaxial wafer b4.

Figure 13:
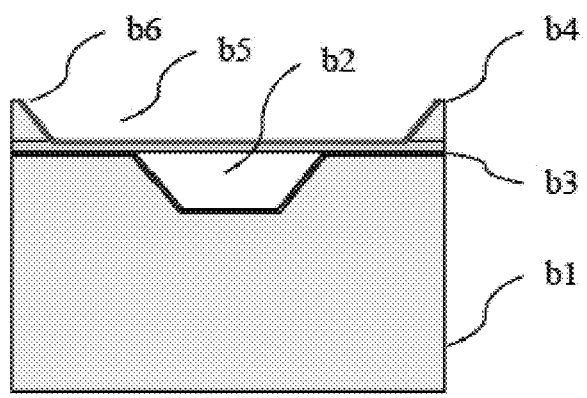

As shown in FIG. 13, an oxide film is formed on the groove b5.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method for forming a cavity in a MEMS pressure sensor chip, comprising:
    forming a first groove in a substrate;
    bonding a covering layer onto the substrate to cover the first groove, so as to form a cavity; and
    etching the covering layer to lower the thickness of the covering layer,
    wherein the step of etching the covering layer further comprises: patterning the covering layer to etch a portion of the covering layer corresponding to the cavity, with other portions of the covering layer remaining.

2. The method according to claim 1, wherein the step of bonding a covering layer onto the substrate further comprises: bonding the covering layer onto the substrate through a fusion bonding.

3. The method according to claim 1, wherein the step of bonding a covering layer onto the substrate further comprises: bonding the covering layer onto the substrate through a bonding layer.

4. The method according to claim 1, wherein the step of etching the covering layer further comprises: wet-etching the covering layer.

5. The method according to claim 1, wherein the etched covering layer has a thickness lower than 10 μm.

6. The method according to claim 1, further comprising: grinding the covering layer to lower a thickness of the covering layer before etching the covering layer.

7. The method according to claim 1, further comprising: forming a thermal oxide layer on an etched surface of the covering layer, and then removing the thermal oxide layer to re-lower the thickness of the covering layer.

8. A method for manufacturing a MEMS pressure sensor chip, comprising: forming a cavity in the MEMS pressure sensor chip by using the method according to claim 1.

9. A MEMS pressure sensor chip, which is manufactured by using the method according to claim 8.

* * * * *

UNITED STATES PATENT AND TRADEMARK OFFICE
CERTIFICATE OF CORRECTION

PATENT NO. : 10,246,323 B2
APPLICATION NO. : 15/559407
DATED : April 2, 2019
INVENTOR(S) : Mengjin Cai Page 1 of 1

It is certified that error appears in the above-identified patent and that said Letters Patent is hereby corrected as shown below:

On the Title Page

Item (30) Foreign Application Priority Data:
"2015 1 021030" should be -- 201510210301.1 --

Item (57) Abstract should read as follows:
-- A cavity forming method for a sensor chip, a manufacturing method thereof, a chip and an electronics apparatus are disclosed. The method for forming a cavity in a MEMS pressure sensor chip comprises: forming a first groove in a substrate; bonding a covering layer onto the substrate to cover the first groove, so as to form a cavity; and etching the covering layer to lower the thickness of the covering layer --

Signed and Sealed this
Twenty-eighth Day of May, 2019

Andrei Iancu
*Director of the United States Patent and Trademark Office*